United States Patent
Lewis

(10) Patent No.: US 8,315,302 B2
(45) Date of Patent: Nov. 20, 2012

(54) PULSE WIDTH MODULATOR USING INTERPOLATOR

(75) Inventor: Michael Lewis, Märsta (SE)

(73) Assignee: Infineon Technologies AG, Neubiberg (DE)

( * ) Notice: Subject to any disclaimer, the term of this patent is extended or adjusted under 35 U.S.C. 154(b) by 966 days.

(21) Appl. No.: 11/756,404

(22) Filed: May 31, 2007

(65) Prior Publication Data

US 2008/0298454 A1   Dec. 4, 2008

(51) Int. Cl.
H03K 7/08 (2006.01)

(52) U.S. Cl. .......... 375/238; 327/31; 327/172; 329/312; 370/205; 370/212

(58) Field of Classification Search .................... 375/328
See application file for complete search history.

(56) References Cited

U.S. PATENT DOCUMENTS

| | | | | |
|---|---|---|---|---|
| 5,951,673 | A * | 9/1999 | Miyata | 712/36 |
| 6,236,908 | B1 * | 5/2001 | Cheng et al. | 701/1 |
| 6,473,457 | B1 * | 10/2002 | Pascual et al. | 375/238 |
| 6,549,085 | B1 * | 4/2003 | Wagh et al. | 332/109 |
| 6,606,044 | B2 * | 8/2003 | Roeckner et al. | 341/143 |
| 6,665,338 | B1 * | 12/2003 | Midya et al. | 375/238 |
| 6,782,359 | B2 * | 8/2004 | Lin et al. | 704/219 |
| 7,224,728 | B2 * | 5/2007 | Komamura | 375/238 |
| 7,245,237 | B2 * | 7/2007 | Lopez-Estrada | 341/61 |
| 7,317,758 | B2 * | 1/2008 | Alrutz et al. | 375/238 |
| 7,480,331 | B2 * | 1/2009 | Braun | 375/238 |
| 7,649,935 | B2 * | 1/2010 | Song et al. | 375/238 |
| 7,659,778 | B2 * | 2/2010 | Vainsencher | 330/10 |
| 2003/0195744 | A1 * | 10/2003 | Lin et al. | 704/208 |
| 2003/0222998 | A1 * | 12/2003 | Yamauchi et al. | 348/262 |
| 2004/0052300 | A1 * | 3/2004 | Lopez-Estrada | 375/130 |
| 2004/0052314 | A1 * | 3/2004 | Copeland | 375/296 |
| 2004/0213343 | A1 * | 10/2004 | Komamura | 375/238 |
| 2005/0110667 | A1 | 5/2005 | Borisavljevic | |
| 2006/0045294 | A1 * | 3/2006 | Smyth | 381/309 |
| 2006/0280360 | A1 * | 12/2006 | Holub | 382/162 |
| 2008/0263336 | A1 * | 10/2008 | Dhong et al. | 712/222 |
| 2008/0298454 | A1 * | 12/2008 | Lewis | 375/238 |

FOREIGN PATENT DOCUMENTS

WO    92/11699 A1   7/1992

* cited by examiner

Primary Examiner — David Ometz
Assistant Examiner — Santiago Garcia
(74) Attorney, Agent, or Firm — SpryIP, LLC

(57) ABSTRACT

A modulator using a polynomial interpolator is described herein. In a simple circuit implementation of the modulator, coefficients of a representative polynomial are generated with interpolation filters in the polynomial interpolator. Crossing points may be identified for each sampling period by incorporating a virtual carrier waveform with the representative polynomial to generate a switching output control. Among other applications, the described modulator may be used in a Class-D amplifier. The described implementations may further confer benefits such as micro-power low voltage operation, low sampling rate, and low harmonic distortion.

28 Claims, 8 Drawing Sheets

PULSE WIDTH MODULATOR USING INTERPOLATOR

TECHNICAL FIELD

Embodiments of the present disclosure generally relate to the field of amplifiers with pulse width modulators; and more particularly to modulators in class-D amplifiers.

BACKGROUND

With a higher theoretical maximum efficiency and a broader effective operational range, Class-D amplifiers are designed to meet the low-power, small size, and growing sound quality requirements for many electronic devices. More specifically, the high power efficiency of Class-D amplifiers translates into less power consumption for a given output power and drastically reduces associated heatsink requirements, which account for an important part of the weight, cost, and size of the electronic device.

Additional design advantages of Class-D amplifiers over other amplifiers, such as Class-A, and AB topologies, include a reduced relative load on the power supply for the same power output. This reduction allows a designer to use a smaller supply. As such, Class-D amplifiers are attractive for low-power, low-cost electronic systems since they offer high efficiency and compact support devices.

Fundamentally, Class-D amplifiers begin the amplification process by translating a received signal over a sampled interval into a pulse modulated signal by operation of switching output devices. In one operational state, current from a power source flows through the switching output devices to generate a pulse output signal. In another operating state, the switching output devices disconnect the power source from the output conduction path and thus behave like an open-circuit so no current should flow from the power source. Class-D amplifiers may use a variety of modulation techniques, such as variations of pulse-width modulation (PWM) and sigma-delta pulse density modulation (PDM), to reduce the amplitude of spectral components at high-frequencies and minimize electromagnetic interference emissions.

BRIEF DESCRIPTION OF THE DRAWINGS

Non-limiting and non-exhaustive exemplary embodiments of the present disclosure are described with reference to the following drawings in which.

DETAILED DESCRIPTION

Figure 1A:
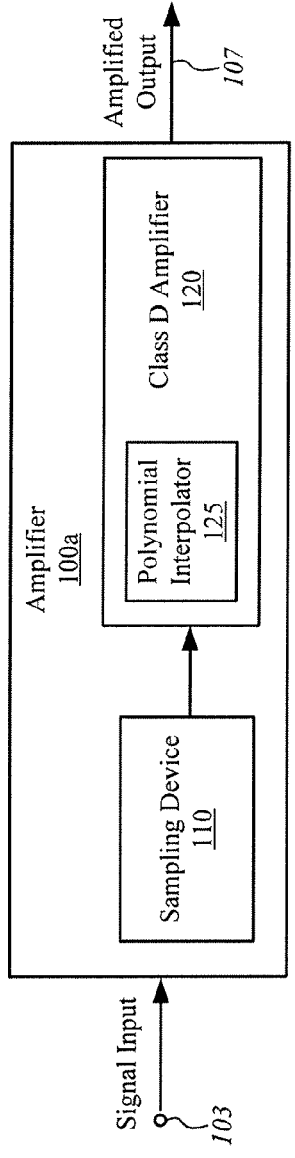
FIGS. 1A-1C illustrate circuit block diagrams of a portion of amplifier circuits in accordance with various embodiments of the present disclosure.

Briefly stated, a modulator using a polynomial interpolator is described below which features a simple circuit implementation. The polynomial interpolator generates coefficients of a representative polynomial using interpolation filters. Crossing points may be identified for each sampling period by incorporating a virtual carrier waveform with the representative polynomial to generate a switching output control. The described implementations may further confer benefits such as micro-power low voltage operation, low sampling rate, and low harmonic distortion. In a Pulse Width Modulator (PWM) configured in accordance with various embodiments of the modulator, a polynomial interpolator is arranged to identify a crossing point associated with each cycle of a pulse width modulated waveform and generates a switching output control signal. Among other applications, the described PWM may be used in a Class-D amplifier. The described implementations may also help address space constraints and battery-consumption requirements of cellular handsets, handheld game machines, digital media players, laptop computers, digital cameras, personal digital assistants (PDAs), and other handheld or portable electronic devices.

In the following detailed description, reference is made to the accompanying drawings which form a part hereof wherein like numerals designate like parts throughout, and in which are shown, by way of illustration, specific embodiments in which the disclosure may be practiced. It is to be understood that other embodiments may be utilized and structural or logical changes may be made without departing from the scope of the present disclosure. Therefore, the following detailed description is not to be taken in a limiting sense, and the scope of the present disclosure is defined by the appended claims and their equivalents.

Throughout the specification and claims, the following terms take at least the meanings explicitly associated herein, unless the context clearly dictates otherwise. The meanings identified below are not intended to limit the terms, but merely provide illustrative examples for use of the terms. The meaning of "a," "an," and "the" may include reference to both the singular and the plural. Reference in the specification to "one embodiment" or "an embodiment" means that a particular feature, structure, or characteristic described in connection with the embodiment is included in at least one embodiment of the disclosure. The meaning of "in" may include "in" and "on." The appearances of the phrases "in one embodiment" or "in an embodiment" in various places in the specification do not necessarily all refer to the same embodiment, but it may. The term "connected" may mean a direct electrical, electromagnetic, mechanical, logical, or other connection between the items connected, without any electrical, mechanical, logical or other intermediary therebetween. The term "coupled" can mean a direct connection between items, an indirect connection through one or more intermediaries, or communication between items in a manner that may not constitute a connection. The term "circuit" or "circuitry" as used in any embodiment described herein, can mean a single component or a plurality of components, active and/or passive, discrete or integrated, that are coupled together to provide a desired function and may include, for example, singly or in any combination, hardwired circuitry, programmable circuitry, state machine circuitry, and/or firmware that stores instructions executed by programmable circuitry. The term "signal" can mean at least one current, voltage, charge, data, or other such identifiable quantity.

In an effort to clarify comparative phrases used in the specification and the claims of this disclosure, please note that the following phrases take at least the meanings indicated and associated herein, unless the context clearly dictates otherwise. The phrase "A/B" means "A or B". The phrase "A and/or B" means "(A), (B), or (A and B)". The phrase "at least one of A, B and C" means "(A), (B), (C), (A and B), (A and C), (B and C) or (A, B and C)". The phrase "(A) B" means "(A B) or (B)", that is "A" is optional.

Figure 1B:
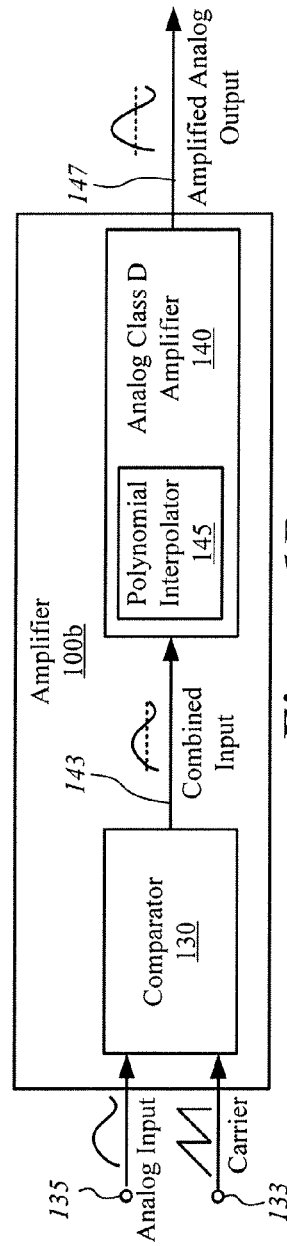
Figure 1C:
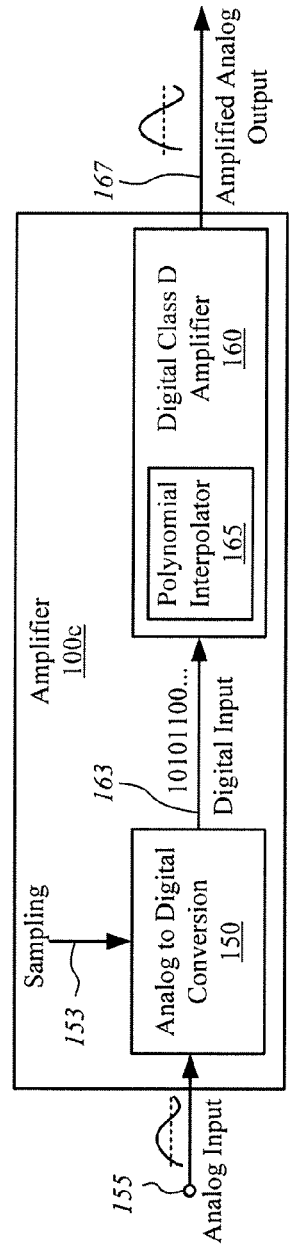

Referring now to FIGS. 1A-1C, wherein block diagrams of a portion of three amplifier circuits, in accordance with various embodiments of the present disclosure, are shown. As illustrated in FIG. 1A, amplifier 100a includes Input/Output (I/O) terminals 103 and 107, sampling device 110, and Class-D amplifier 120 with a polynomial interpolator 125, coupled to each other as shown. The Class-D amplifier 120 includes output transistors that are configured to be operated as switches. In a pulse-width modulation (PWM) configuration, the output terminal 107 is driven by a pulse train with a frequency substantially greater than the highest frequency of interest in the signal. For example, the pulse train might exhibit a frequency at least twice the highest frequency of interest, but more preferably 10-20 times the highest frequency of interest. In various embodiments the duty cycle of the pulses are varied such that the desired signal may be recreated by passing the output through a lowpass filter. Such an amplifier 100 is attractive for low-power, low-cost systems since it offers very high efficiency and compact output transistors.

As illustrated in FIG. 1B, analog amplifier 100b includes a comparator 130 and an analog Class-D amplifier 140 with a polynomial interpolator 145. The comparator 130 is configured to receive a high-frequency sawtooth "carrier" signal 133 and an input signal 135. Once the signals are comparatively combined, the analog Class-D amplifier 140 receives the combined input 143 and amplifies the signal to generate an amplified analog output 147.

A digital amplifier 100c is illustrated in FIG. 1C and includes a Class-D amplifier 160 with a polynomial interpolator 165 coupled with an analog-to-digital converter 150. In the illustrated embodiment, the digital Class-D amplifier 160 receives a digital input signal 165 from the analog-to-digital converter 150 and generates an amplified analog output 167. In one embodiment, the analog-to-digital converter 150 includes a pulse width modulator to translate an analog input signal 155 into a digitized signal according to a sampling control signal 153. Upon reception of the digital input signal 165, one embodiment of the digital Class-D amplifier 160 applies a polynomial interpolator to the digitized input signal 163 to generate the amplified analog output 167. In alternate embodiments, the present disclosure may be practiced without one or more of the above enumerated elements, e.g., the comparator 130 or the analog-to-digital converter 150.

Figure 2:
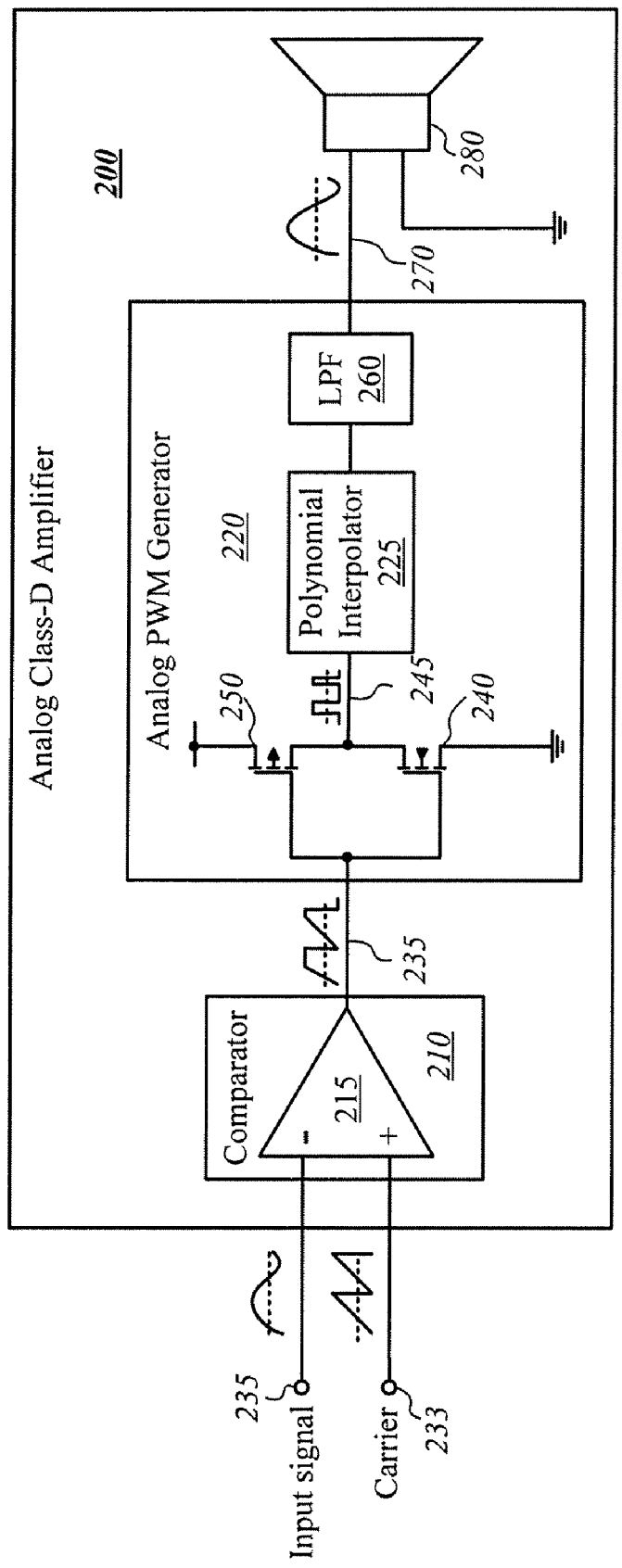
FIG. 2 illustrates a circuit block diagram of a portion of an analog Class-D amplifier circuit as presented in FIG. 1B in further detail, in accordance with various embodiments of the present disclosure.

Referring now to FIG. 2, a circuit block diagram of a portion of an analog amplifier 200, in accordance with various embodiments as presented in FIG. 1B, is shown in further detail. The analog amplifier 200 is a continuous-time system, such that. all signals are defined at all points in time and includes a comparator 210, an analog pulse width modulation (PWM) generator 220, and optionally a speaker 280 for audio signals. The comparator 210 is configured to receive a high-frequency sawtooth "carrier" signal 233 and an input signal 235. Comparator 210 generates a pulse train in response to a comparison of the input signal 235 with the high-frequency sawtooth "carrier" signal 233. The pulse train is arranged to drives the analog PWM generator 220.

When the carrier signal 233 is of lower amplitude than the input signal 235, the output switching transistors 240 and 250 drive a high signal, and when the carrier signal 233 is of higher amplitude than the input signal 235, the output switching transistors 240 and 250 drive a low signal. In one embodiment, the output switching transistors 240 and 250 are field effect transistors (FETs) such as junction-type FETs (JFETs) or metal-oxide-semiconductor FETs (MOSFETs). Alternatively, other transistor types may be used particularly where full bandwidth is not required and higher distortion levels are tolerable.

The low-pass filter 260 is arranged to eliminate components of the carrier signal 233 and pass the analog output signal 270. The analog output signal 270 may optionally be coupled to a speaker 280 in various embodiments where the analog output signal 270 is an audio signal. A "natural sampling" method of generating a pulse-width modulated signal generally includes a carrier signal 233 with a frequency that is at least twice the highest frequency of interest, but more preferably the carrier signal frequency is 10-20 times the highest frequency of interest. The generated pulse-width modulated signal 245 may result in an output signal 270 with almost no harmonic distortion when the output switch of the output switching transistors 240 and 250 is ideal.

Figure 8:
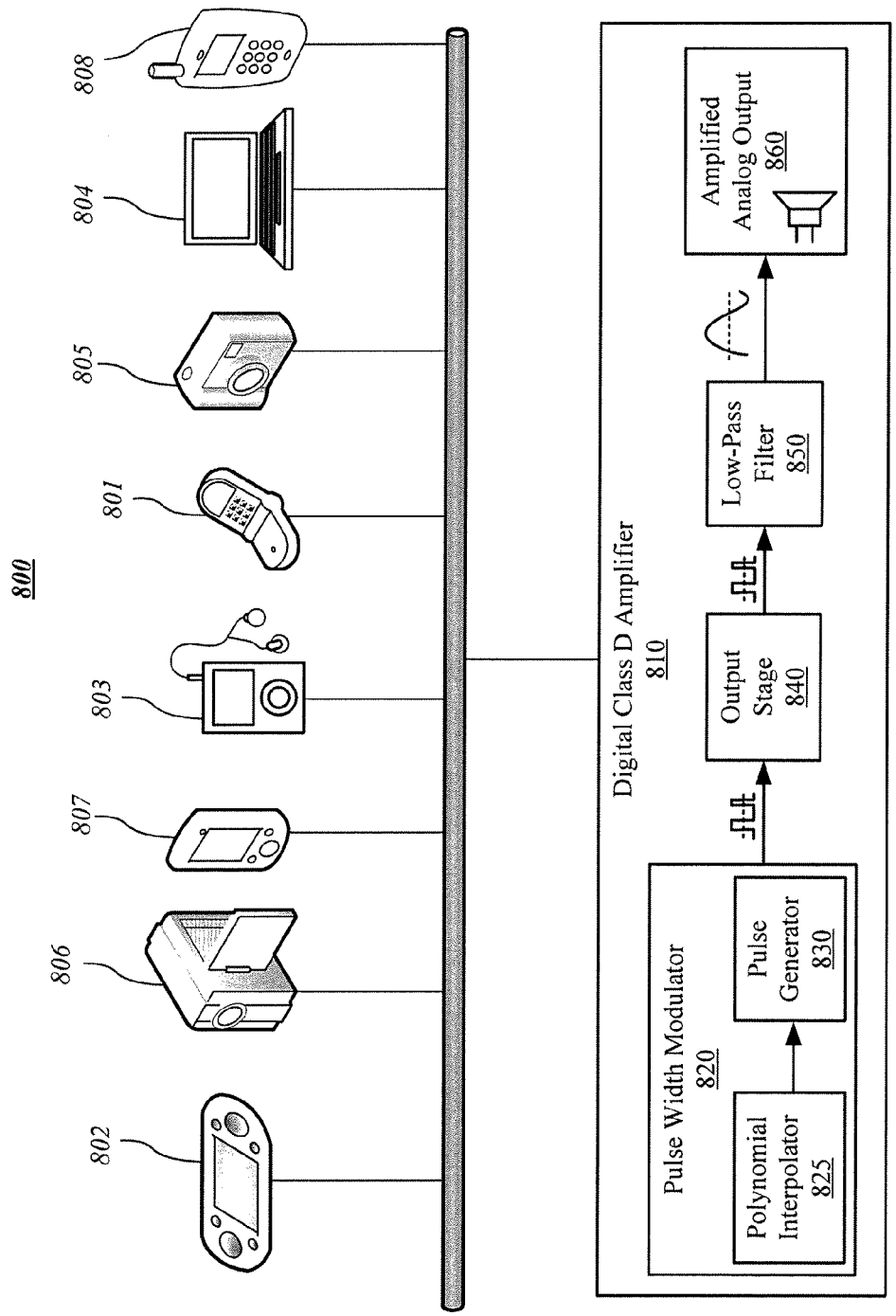
FIG. 8 illustrates a block diagram of exemplary precision electronic devices having a digital Class-D amplifier according to various embodiments.

While the continuous-time system described in FIG. 2 is useful when all signals are defined at all points in time, a different amplifier (e.g., see FIG. 3) is often required to generate an analog output from a digitized input signal. Digitized input signals may be provided from any variety of forms of digital media associated with handheld or portable electronic devices as illustrated in FIG. 8. For example, the space constraints and battery-consumption requirements on cellular handsets 801, handheld game machines 802, digital media players 803, laptop computers 804, digital cameras 805 and camcorders 806, personal digital assistants (PDAs) 807, and other handheld or portable electronic devices 808 invite the use of digital Class-D amplifiers to translate and amplify digitized signals. Digitized signals may only be defined at discrete points in time. A modulator having a polynomial interpolator and a pulse generator may translate and amplify the interval between the discrete points of a digitized signal without significant distortion.

Figure 3:
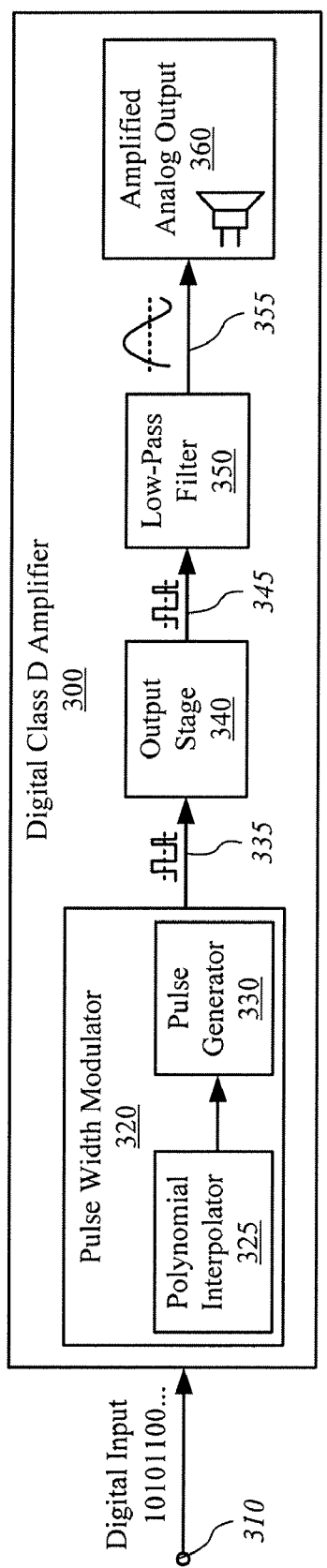
FIG. 3 illustrates a circuit block diagram of a portion of a digital Class-D amplifier circuit as presented in FIG. 1C in further detail, in accordance with various embodiments of the present disclosure.

Referring now to FIG. 3, a circuit block diagram of a portion of a digital Class-D amplifier circuit 300 as presented in FIG. 1C is illustrated in further detail in accordance with various embodiments of the present disclosure. The digital Class-D amplifier circuit 300 includes a pulse width modulator 320, an output switching stage 340, a low pass filter 350, and an optional output device for amplified analog output 360. The pulse width modulator 320 includes a polynomial interpolator 325 to receive a digitized signal 310, such as Pulse Code Modulation (PCM) audio data, and to generate a digital representation of switching instants for use by a pulse generator 330 to generate a switching output control signal 335. In one embodiment where pulse width modulation is used, the switching output control signal 335 enables the output switching stage 340 to produce a pulse width waveform 345 with a fixed frequency. In one example, the pulse width waveform 345 is not divided equally and is instead has a varying pulse width that is dependent on the input signal.

For this example, the pulse width waveform 345 varies following the incoming switching output control signal 335. Accordingly, the time that the resulting pulse width waveform 345 is in the "high" and "low" states is dependent on the state of the output control signal 335. The resulting signal is not necessarily spending an equal time period in the "high" state relative to the "low" state, but it may. In one embodiment, when the input switching output control signal 335 increases, the "high" state will be present for longer than the "low" state. Accordingly, when the input switching output control signal 335 decreases, the "low" state will be present in the pulse width waveform 345 for longer than the "high" state.

Once the pulse width waveform 345 passes through the low pass filter 350 an amplified analog signal 355 is generated. The amplified analog signal 355, such as an audio signal, may optionally be input into an analog output device 360, such as a speaker (internal or external), a transmission line, a signal transmitter, or storage device.

One of the challenges of amplifying a signal using a Class-D amplifier is properly identifying a crossing point during each sampling interval where a carrier waveform becomes greater than the signal waveform to be amplified. Unless the appropriate crossing point may be identified, the switching process of the Class-D amplifier may introduce spectral components, such as harmonic distortion, into the signal.

In one embodiment the natural sampling process identifies a crossing point in time during a given cycle where the carrier waveform crosses the representative signal waveform and the output would change between operational states (e.g., from "high" to "low" or from "low" to "high"). For example in the embodiment illustrated in FIG. 4, the analog signal 420 crosses a switching threshold 420 represented by an intersection point 440. However, the discrete-time nature of the digitized signal 310 makes it problematic to find the ideal switching instant that would be given by the natural sampling method. For example, with the digital Class-D amplifier circuit 300, the carrier waveform may become only a virtual carrier waveform that is represented only within signal processing algorithms. The digitized signal 310 may even be accurately known in amplitude, such as an audio signal represented with 16 bits of precision. However, to avoid distortion in the output 355, even the 16-bit audio signal is translated into a pulse width waveform 345 with similarly precise timing accuracy.

Figure 4:
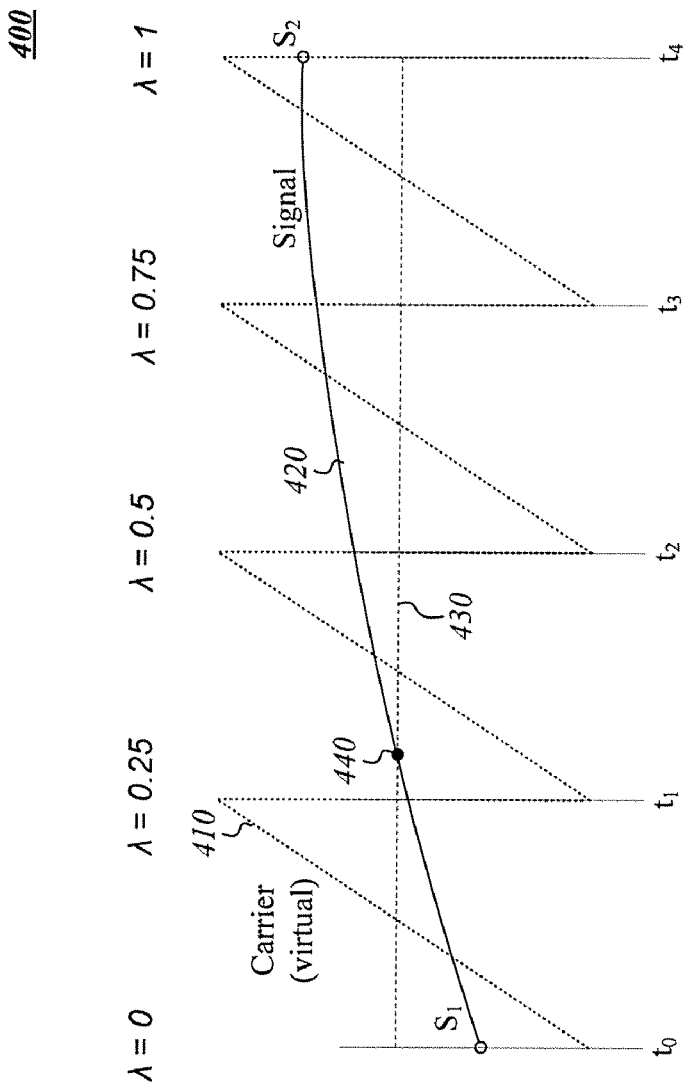
FIG. 4 illustrates a timing diagram view of a portion of a natural sampling of component signals in a pulse width modulator waveform in accordance with various embodiments.

Referring now to FIG. 4, a timing diagram view of component signals during a signal sample period 400 is illustrated in accordance with various embodiments. The signal sample period 400 includes a sawtooth carrier waveform 410 with multiple discrete cycles relative to the overall sample window. For example, the illustrated embodiment depicts four cycles ($t_0$-$t_1$, $t_1$-$t_2$, $t_2$-$t_3$, and $t_3$-$t_4$) during the analog sample window ($S_1$-$S_2$) taken over the time interval from $t_0$ to $t_4$ of an analog signal 420. Other cycle frequencies may also be selected for the sawtooth carrier waveform 410. The frequency of the sawtooth carrier waveform 410 is generally at a higher frequency than the analog signal 420. In one embodiment, the sawtooth carrier waveform 410 is in the range of a few hundred kilohertz (kHz) relative to the analog signal 420 at 10-50 kHz. Due to the disparity between the frequency of the sawtooth carrier waveform 410 and the analog signal 420, the crossing point of the ideal digitized signal waveform and the virtual carrier waveform may be identified through a specialized interpolation between the two samples. In one embodiment, the intersection 440 of a switching threshold 430 with the analog signal 420 defines a crossing point during a given sample period where the carrier waveform becomes less than the signal waveform and the output for the pulse width modulator waveform cycle would change from a first state (e.g., a "low" state) to a second state (e.g., a "high" state).

In one embodiment, output may be continuously interpolated between two sampling instants by varying parameter $\lambda$. In FIG. 4, the parameter $\lambda$ varies between 0 and 1 during a sample period 400. Alternatively, transformed versions of the polynomial interpolator and pulse generator of the pulse width modulator are possible where $\lambda$ takes different ranges of values, without departing from the scope of the disclosure.

Figure 5:
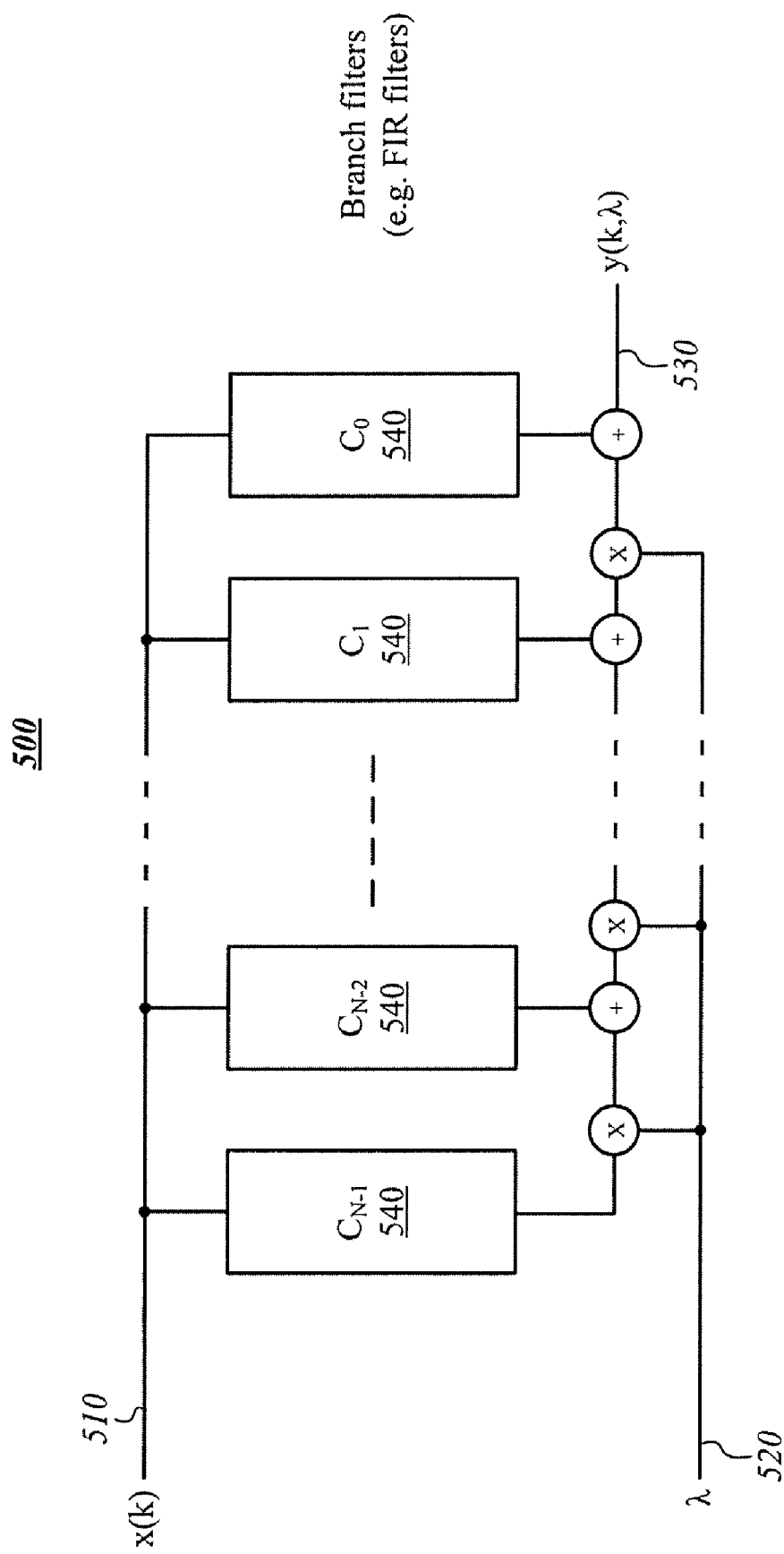
FIG. 5 illustrates a block diagram of a portion of a fractional delay filter structure in accordance with various embodiments of the present disclosure.

Referring now to FIG. 5, a block diagram of a portion of a fractional delay filter structure 500 is shown in accordance with various embodiments. The fractional delay filter structure 500 receives a digitized signal 510, x(k), and performs a type of polynomial interpolation by varying parameter 520, $\lambda$, of a polynomial 530, y(k, $\lambda$), where the coefficients of the polynomial 530 are generated by the output of a bank of branch filters 540, $C_j(k)$.

In some embodiments, the branch filters 540 operate at the input data sample rate and have constant parameters, which may be built practically using an efficient VLSI implementation. In additional embodiments, the output may be continuously interpolated between two sampling instants by varying the $\lambda$ parameter 520. In FIG. 4, the variation parameter, $\lambda$, varies between 0 and 1. Other embodiments using transformed versions of the filter are also possible where the parameter $\lambda$ varies across a different range of values.

The output of the branch filters 540 is expressed as a polynomial in $\lambda$, where the coefficients are the outputs of the individual branch filters, $C_j(k)$, according to:

$$y(k, \lambda) = C_{N-1}(k)\lambda^{N-1} + C_{N-2}(k)\lambda^{N-2} + \ldots + C_2(k)\lambda^2 + C_1(k)\lambda + C_0(k)$$

Figure 6:
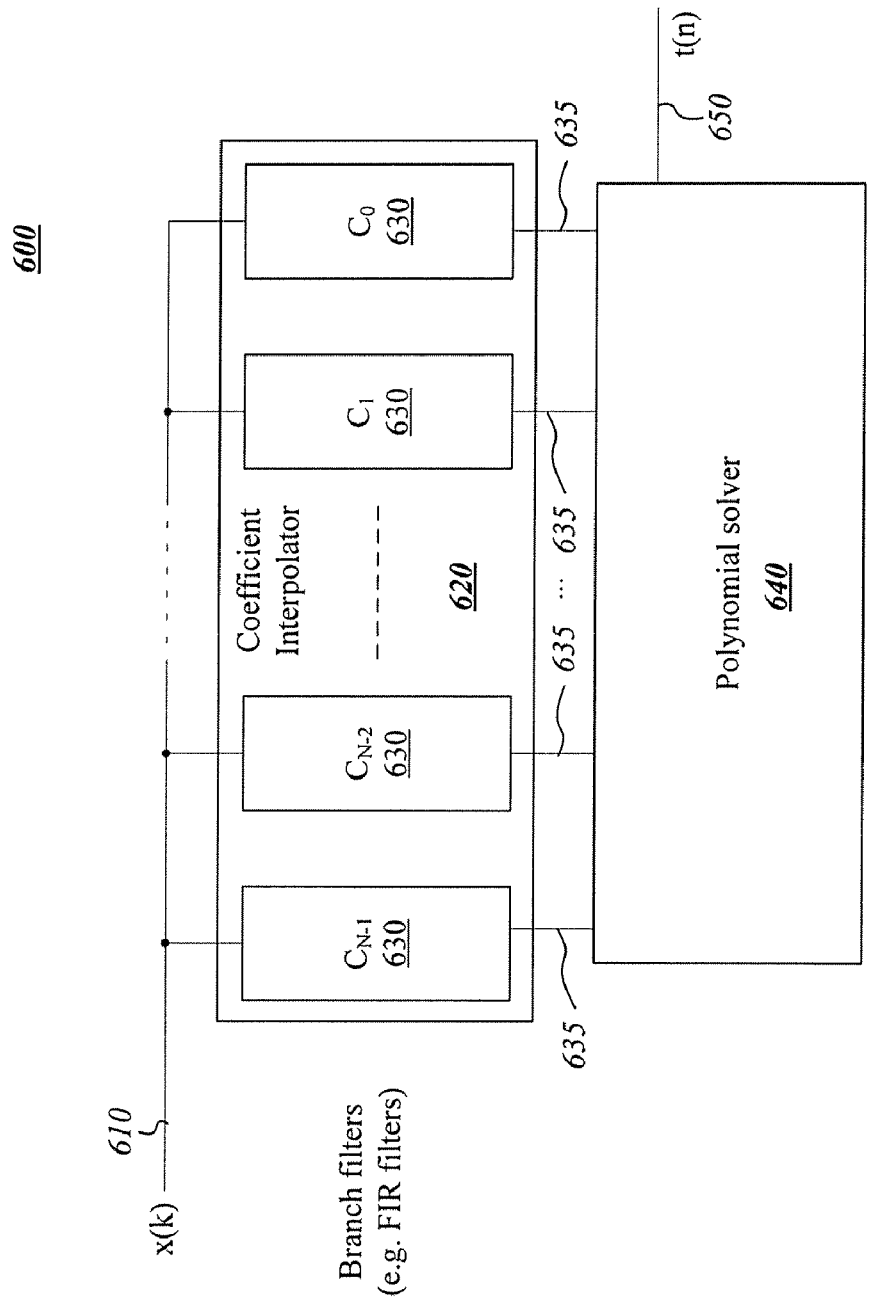
FIG. 6 illustrates a block diagram of a portion of an interpolator in accordance with various embodiments of the present disclosure.

Referring now to FIG. 6, a block diagram of a portion of an interpolator 600 is shown in accordance with various embodiments. The interpolator 600 includes a coefficient interpolator 620 having a plurality of branch filters 630, $C_j(k)$, optimized to generate coefficients 635 of an interpolation polynomial and a polynomial solver 640 configured to solve the combined polynomial for each pulse width modulation cycle and convert the result into a switching instant 650, t(n). The coefficient interpolator 620 receives a digitized signal 610, x(k), and begins the task of finding the crossing point. Each branch filter 630, $C_j(k)$, calculates a coefficient of the polynomial as described in FIG. 5 for the combined carrier signal waveform and analog waveform.

In some embodiments, a virtual carrier signal 410 (see FIG. 4) of the digitized signal 610 ranges from about −1 to about +1 within a pulse width modulator waveform cycle (see e.g., $t_0$-$t_1$, $t_1$-$t_2$, $t_2$-$t_3$, and $t_3$-$t_4$ of FIG. 4) and may be expressed as a fraction of total pulse width modulated period, $T_{pwm}$, relative to sample time, $T_S$, in terms of $\lambda$ as:

$$V(\lambda) = -1 + 2(\lambda - \lambda_0) \cdot \frac{T_S}{T_{pwm}}$$

where $\lambda_0$ is $\lambda$ at a start of the cycle of the pulse width modulated waveform.

Once the virtual carrier signal is identified, a crossing point within a particular sample is associated with the root of a polynomial with known coefficients and may be expressed as:

$$y(k, \lambda) - V(\lambda) = C_{N-1}(k)\lambda^{N-1} + C_{N-2}(k)\lambda^{N-2} +$$
$$\ldots + C_2(k)\lambda^2 + C_1(k)\lambda + C_0(k) + 1 - 2(\lambda - \lambda_0) \cdot \frac{T_S}{T_{pwm}} = 0$$

In some embodiments, conventional root finding techniques may be used to identify the crossing point. For example, an iterative search, such as a Newton-Raphson iteration, may be used to find the root of the polynomial. Depending on the complexity of the polynomial, the root may also be solved algebraically to identify the crossing point. In various embodiments, the correct solution will be that which lies in the range:

$$\left[\lambda_0, \lambda_0 + \frac{T_{pwm}}{T_s}\right]$$

In some embodiments, the time of the pulse width modulation output switch, represented as a fraction of the total pulse width modulation sample period may then be given as:

$$T_{on} = (\lambda - \lambda_0) \cdot \frac{T_S}{T_{pwm}}$$

In some embodiments, the pulse width modulation carrier (see e.g., 133 and 153 in FIGS. 1B and 1C, 233 in FIG. 2, and 410 in FIG. 4) operates at a frequency that is an integer multiple of the sampling frequency. As such, alignment may be established between sampling instants and the relative start and end of pulse width modulation cycles. Alternatively, where the described integer multiple relationship does not exist between the carrier frequency and the sampling frequency, the previously described methodology may still be applied at an additional computational expense. In a non-multiple frequency relationship, solutions for two different polynomials over two different ranges ($\lambda$, k) are identified. In the event that a sampling instant happens to fall in the middle of a pulse width modulation cycle, the resulting solution should be selected which falls within the appropriate range.

Figure 7:
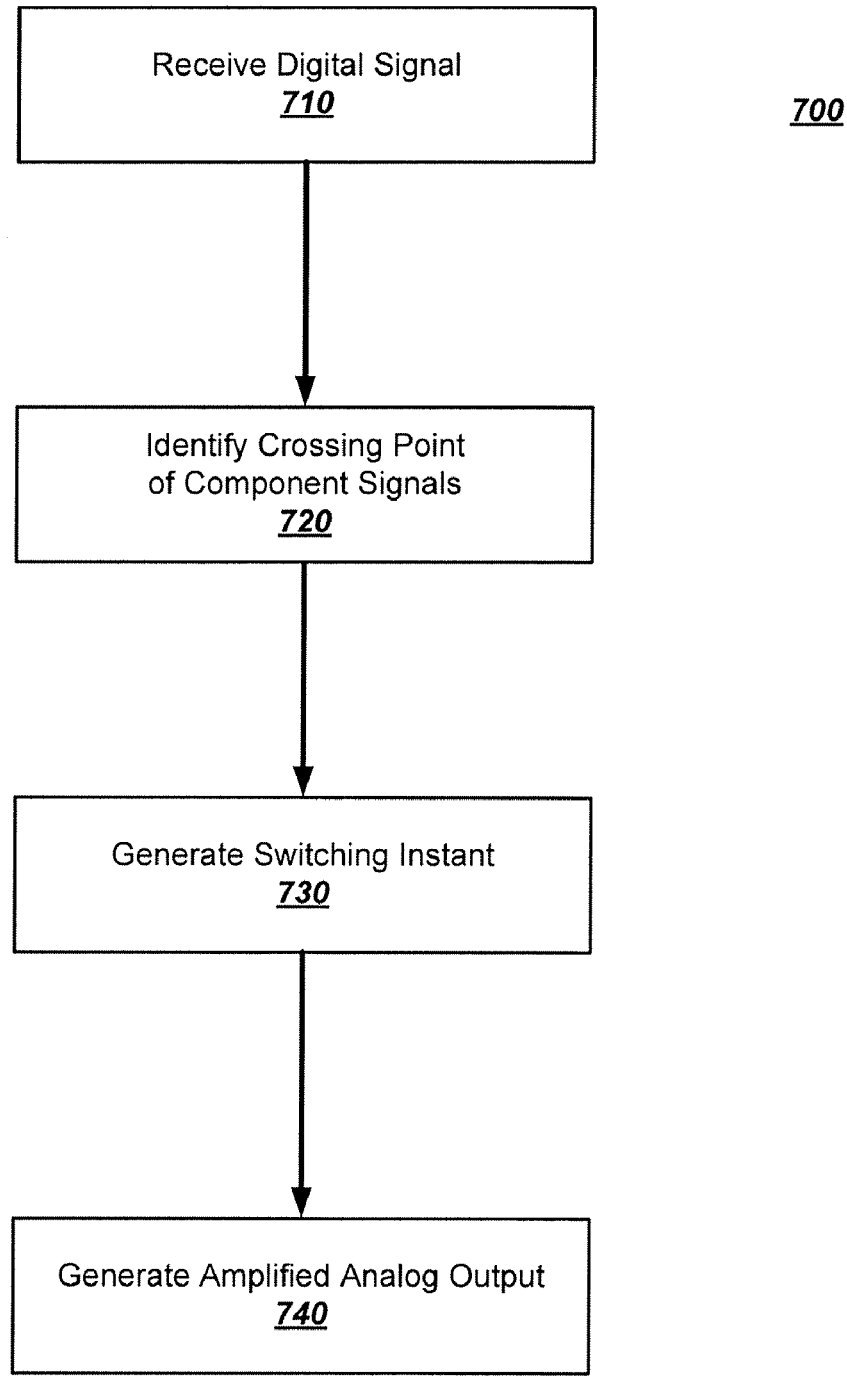
FIG. 7 illustrates a flow diagram view of a method of operation for signal amplification in accordance with various embodiments.

Turning now to FIG. 7, a method, in accordance with various embodiments, is described in terms of firmware (e.g., firmware that is used by a processor such as a micro-processor, a micro-controller, an ASIC, or a DSP processor), software, and/or hardware with reference to a flow diagram. Describing the method by reference to a flow diagram enables one skilled in the art to develop programs, including instructions to carry out the methods on suitably configured electronic amplification devices. In various embodiments, portions of the operations to be performed by an amplification device may constitute circuits, general purpose processors (e.g., micro-processors, micro-controllers, or digital signal processors), special purpose processors (e.g., application specific integrated circuits or ASICs), state machines, hardware arrays, reconfigurable hardware, and/or software made up of executable instructions. The executable instructions may be embodied in firmware logic, reconfigurable logic, a hardware description language, a state machine, an application-specific integrated circuit (ASIC), or combinations thereof.

With respect to various embodiments using a software implementation (e.g., a hardware simulator), at least one of the processors of a suitably configured electronic amplification device executes the instructions from a storage medium.

The computer-executable instructions may be written in a computer programming language or executable code. If written in a programming language conforming to a recognized standard, such instructions may be executed on a variety of hardware platforms and may interface with a variety of operating systems. Although the various embodiments are not described with reference to any particular programming language, it will be appreciated that a variety of programming languages may be used to implement the teachings of the embodiments as described herein. Furthermore, it is common in the art to speak of software in one form or another (e.g., program, procedure, process, application, etc.) as taking an action or causing a result. Such expressions are merely a shorthand way of saying that execution of the software by a device causes the processor of the computer to perform an action or a produce a result.

Still referring to FIG. 7, a flow diagram view of a method of operations for digital signal amplification is shown in accordance with various embodiments. Collectively, the amplification, interpolation, and filtration operations may be referred to as the amplification method/process 700.

A digitized signal defining an analog signal waveform at discrete points in time according to a sampling frequency is received by an amplifier (see e.g., 300 in FIG. 3) in block 710. The amplifier (see e.g., 300 in FIG. 3) initiates interpolation by a fractional delay filter structure (see e.g., 500 in FIG. 5) in block 720. In one embodiment, the interpolation is performed between a virtual carrier waveform (see e.g., 410 in FIG. 4) and the signal waveform (see e.g., 420 in FIG. 4). In various embodiments, the virtual carrier waveform is represented only within the signal processing area of the amplifier. The interpolation process may identify any crossing point (see e.g., 440 in FIG. 4) of the signal waveform and a switching threshold 430 of the virtual carrier waveform (see e.g., 410 in FIG. 4) for each sampling period. In one embodiment, interpolating in block 720 by the filter includes continuously interpolating between two sample instants by varying parameter $\lambda$. In yet another embodiment, interpolating in block 720 by the filter includes generating coefficients of individual branch filters, $C_j(k)$, of a fractional delay filter structure, such as a Farrow filter, according to a polynomial in $\lambda$ to generate an amplified analog output signal of the signal waveform.

In block 730 of the amplification process 700, various embodiments use a pulse generator (see e.g., 330 in FIG. 3) or polynomial solver (see 640 in FIG. 6) to generate a switching instant for each sampling period based in part upon identified crossing points. In one embodiment, the switching instant correlates to a control signal associated with an output switching stage to generate a pulse width waveform.

In block 740 of the amplification process 700, the amplifier (see e.g., 200 in FIG. 2 or 300 in FIG. 3) generates an amplified analog output signal (see e.g., 270 in FIG. 2 or 355 in FIG. 3). In one embodiment, the generated amplified output signal is amplified without significant harmonic distortion of the signal waveform based in part upon proper identification of crossing points in each cycle.

The amplification process 700 may also be used in conjunction with a variety of precision electronic devices, as shown in FIG. 8, that call for implementation of a Class-D amplifier 810. As previously discussed, the amplifier 810 includes a simple amplification circuit that exhibits low micro-power voltage operation, low sampling rates, and/or low distortion and is very useful for devices requiring precision amplification. Example devices having suitable amplification applications for use with described the PWM 820 and polynomial interpolator 825 of the amplifier 810 include precision hearing instruments (e.g., hearing aids), cellular handsets 801, handheld game machines 802, digital media players 803, laptop computers 804, digital cameras 805 and camcorders 806, personal digital assistants (PDAs) 807, and other handheld or portable electronic devices 808.

In addition to the previously described examples, a digital pre-processor can be applied to digital information from the various sources prior to class-D amplification. In one example, digital data is retrieved from a storage means such as an internal flash memory or a hard disk drive in a digital media player device 803. Typically, digital media player devices store digitized audio signals in a compressed format such as a lossy compression (e.g., MP3, MP4, etc.) or a lossless compression format (e.g., Direct Stream Transfer (DST), Free Lossless Audio Codec (FLAC), Shorten (SHN), Meridian Lossless Packing (MLP), Windows Media (WMA) Lossless, Apple Lossless Audio Codec (ALAC), RealAudio Lossless, True Audio Lossless (TTA), WavPack Lossless, Dolby True HD, DTS-HD Master Audio, etc.). In conventional devices the compressed data may be converted into an analog signal that is then passed to the class-D amplifier. The digital pre-processor of the present disclosure can be arranged to convert the compressed data stream into an uncompressed digital data stream that is passed to the class-D amplifier. The conversion process between analog and digital waveforms inherently introduces quantization error. By pre-processing in the digital domain, additional conversions are unnecessary and further quantization errors are avoided.

The above specification, examples and data provide a complete description of the manufacture and use of the composition of the invention. Although specific embodiments have been illustrated and described herein, it will be appreciated by those of ordinary skill in the art and others, that a wide variety of alternate and/or equivalent implementations may be substituted for the specific embodiment shown in the described without departing from the spirit and scope of the present disclosure. This application is intended to cover any adaptations or variations of the embodiments discussed herein. Therefore, it is manifested and intended that the disclosure be limited only by the claims and the equivalence thereof.

What is claimed is:

1. A circuit for generating a switching output control from a signal represented as digital samples, the circuit comprising:
   an interpolation block configured to receive the sampled digital signal and to generate coefficients representing an interpolating polynomial; and
   a polynomial solver block, coupled to the interpolation block, the polynomial solver block configured to:
      solve a combined polynomial incorporating the generated coefficients and an expression representing a virtual carrier waveform, the expression including values of a variation parameter that vary within a predetermined range during each sampling period of the sampled digital signal;
      determine a crossing point associated with each sampling period of the sampled digital signal, each sampling period including a plurality of cycles of the virtual carrier waveform; and
      generate the switching output control.

2. The circuit of claim 1, wherein the sampled digital signal includes a pulse width modulated waveform.

3. The circuit of claim 1, wherein the interpolation block comprises a series of branch filters, $C_j(k)$, configured according to a fractional delay filter structure such that output is described as a polynomial, $y(k,\lambda)$, in a variation parameter, $\lambda$, expressed as:

$$y(k,\lambda) = C_{N-1}(k)\lambda^{N-1} + C_{N-2}(k)\lambda^{N-2} + \ldots + C_2(k)\lambda^2 + C_1(k)\lambda + C_0(k).$$

4. The circuit of claim 3, wherein the sampled digital signal is a pulse width modulated waveform and a virtual carrier signal, $V(\lambda)$, varies relative to a maximum signal amplitude within a cycle of the pulse width modulated waveform and is expressed as a fraction of total pulse width modulated period, $T_{pwm}$, relative to sample time, $T_s$, in terms of the variation parameter, $\lambda$, as:

$$V(\lambda) = -1 + 2(\lambda - \lambda_0) \cdot \frac{T_S}{T_{pwm}},$$

wherein $\lambda_0$ is $\lambda$ at a start of the cycle of the pulse width modulated waveform.

5. The circuit of claim 4, wherein a crossing point of the polynomial, $y(k,\lambda)$, relative to the virtual carrier signal, $V(\lambda)$, within a particular sample is expressed in terms of $\lambda$ as:

$$y(k,\lambda) - V(\lambda) = C_{N-1}(k)\lambda^{N-1} + C_{N-2}(k)\lambda^{N-2} + \ldots + C_2(k)\lambda^2 + C_1(k)\lambda + C_0(k) + 1 - 2(\lambda - \lambda_0) \cdot \frac{T_S}{T_{pwm}} = 0.$$

6. The circuit of claim 5, wherein an iterative search to find a root of the polynomial, $y(k, \lambda)$, relative to the virtual carrier signal, $V(\lambda)$, is used to identify the crossing point.

7. The circuit of claim 6, wherein the iterative search is a Newton-Raphson iterative search.

8. The circuit of claim 5, wherein a root of the polynomial, $y(k,\lambda)$, relative to the virtual carrier signal, $V(\lambda)$, is solved algebraically to identify the crossing point.

9. The circuit of claim 4, wherein a time of the $$T_{on} = (\lambda - \lambda_0) \cdot \frac{T_S}{T_{pwm}}.$$

switching output control, $T_{on}$, is expressed in terms of $\lambda$ as:

10. The circuit of claim 4, wherein a frequency of the virtual carrier signal, $V(\lambda)$, is an integer multiple of a sampling frequency.

11. The circuit of claim 1, wherein the interpolation block includes one or more filters configured to receive input data at a designated sampling rate from the sampled digital signal.

12. A method for amplifying a digitized signal to provide an output signal, the method comprising:
   receiving the digitized signal, wherein the digitized signal is a signal waveform that is quantized at discrete points in time according to a sampling frequency;
   generating a virtual carrier waveform as a digital approximation within digital signal processing;
   generating an interpolation between the virtual carrier waveform and the digitized signal within the digital signal processing such that a crossing point of the signal waveform and a switching threshold is identified for each sampling period within the digital signal processing, the switching threshold indicating when the virtual carrier waveform is less than the digitized signal and each sampling period including a plurality of cycles of the virtual carrier waveform.

13. The method of claim 12, further comprising generating a switching instant for each sampling period based in part upon the identified crossing point.

14. The method of claim 12, further comprising generating coefficients of a polynomial expression that interpolates the digitized signal waveform between sampling instants.

15. The method of claim 14, wherein the generating the interpolation comprises incorporating the virtual carrier waveform into the polynomial expression for the digitized signal waveform between the sampling instants.

16. The method of claim 15, wherein a solution to the combined polynomial expression of the virtual carrier waveform and the digitized signal waveform identify a crossing point of the digitized signal waveform and the switching threshold for each sampling period.

17. The method of claim 12, wherein the interpolating includes continuously interpolating between two sampling instants by a variation parameter, $\lambda$.

18. The method of claim 17, wherein the interpolating includes generating coefficients of individual branch filters, $C_j(k)$, according to a polynomial in $\lambda$, expressed as:

$$y(k,\lambda) = C_{N-1}(k)\lambda^{N-1} + C_{N-2}(k)\lambda^{N-2} + \ldots + C_2(k)\lambda^2 + C(k)\lambda + C_0(k).$$

19. The method of claim 12, wherein the interpolating includes application of a fractional delay filter structure to generate coefficients of a polynomial in a variation parameter, $\lambda$, to generate an amplified analog output signal of the signal waveform.

20. The method of claim 19, wherein the fractional delay filter structure is a Farrow filter.

21. The method of claim 12, further comprising generating an amplified analog output signal with low distortion of the signal waveform based in part upon the identified crossing point.

22. An amplifier system, comprising:
 a sampling device to sample a received input signal at discrete points in time and to generate a digital sampled signal waveform;
 a pulse width modulator, coupled to the sampling device, having a polynomial interpolator and a pulse generator, the polynomial interpolator configured to determine a root of a polynomial, $y(k,\lambda)$, in a variation parameter, $\lambda$, expressed for the digital sampled signal waveform as:

$$y(k,\lambda) - V(\lambda) = C_{N-1}(k)\lambda^{N-1} + C_{N-2}(k)\lambda^{N-2} + \ldots + C_2(k)\lambda^2 + C_1(k)\lambda + C_0(k) + 1 - 2(\lambda - \lambda_0) \cdot \frac{T_S}{T_{pwm}} = 0$$

and the pulse generator configured to generate a switching instant for each sampling period based in part upon the root; and
 an output stage, coupled to the pulse width modulator; configured to generate an amplified analog output signal of the received input signal based in part on the switching instant for each sampling period.

23. The amplifier system of claim 22, wherein the output stage includes a low-pass filter.

24. The amplifier system of claim 22, wherein the received input signal is a digitized signal.

25. The amplifier system of claim 22, wherein the received input signal is an analog signal.

26. The amplifier system of claim 22, wherein the received input signal is a pulse width modulated signal.

27. The amplifier system of claim 22, wherein the root for each sampling period is a crossing point of a signal waveform and a switching threshold during a sample period.

28. The amplifier system of claim 22, wherein a virtual carrier waveform is represented only within signal processing.

* * * * *